(12) United States Patent
Suzuki et al.

(10) Patent No.: US 9,491,384 B2
(45) Date of Patent: Nov. 8, 2016

(54) SOLID IMAGING DEVICE INCLUDING PHOTOELECTRIC CONVERSION UNIT AND TDI TRANSFER UNIT

(75) Inventors: Hisanori Suzuki, Hamamatsu (JP);
Yasuhito Yoneta, Hamamatsu (JP);
Kentaro Maeta, Hamamatsu (JP);
Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/258,344

(22) PCT Filed: Mar. 25, 2010

(86) PCT No.: PCT/JP2010/055239
§ 371 (c)(1),
(2), (4) Date: Sep. 21, 2011

(87) PCT Pub. No.: WO2010/113760
PCT Pub. Date: Oct. 7, 2010

(65) Prior Publication Data
US 2012/0007149 A1 Jan. 12, 2012

(30) Foreign Application Priority Data
Apr. 1, 2009 (JP) ................. 2009-089157

(51) Int. Cl.
*H01L 27/00* (2006.01)
*H04N 5/372* (2011.01)
*H04N 5/359* (2011.01)
*H01L 27/148* (2006.01)
*H01L 31/113* (2006.01)

(52) U.S. Cl.
CPC .... *H04N 5/37206* (2013.01); *H01L 27/14856* (2013.01); *H01L 27/14887* (2013.01); *H04N 5/3592* (2013.01); *H01L 27/14831* (2013.01); *H01L 31/113* (2013.01)

(58) Field of Classification Search
USPC .................................. 257/E31.084
See application file for complete search history.

(56) References Cited

U.S. PATENT DOCUMENTS 6,278,142 B1* 8/2001 Hynecek ......................... 257/247
2009/0040502 A1* 2/2009 Hashimoto et al. ......... 356/5.01

FOREIGN PATENT DOCUMENTS

| EP | 1 944 571 | 7/2008 |
|---|---|---|
| JP | 11-298805 | 10/1999 |
| JP | 2002-64197 | 2/2002 |
| JP | 2002-231914 | 8/2002 |
| JP | 2003-521837 | 7/2003 |
| JP | 2006-064197 | 3/2006 |
| WO | WO 00/57633 | 9/2000 |
| WO | WO 2008/011064 | 1/2008 |
| WO | WO 2008/066067 | 6/2008 |

* cited by examiner

*Primary Examiner* — Caleb Henry
*Assistant Examiner* — Alexander Belousov
(74) *Attorney, Agent, or Firm* — Drinker Biddle & Reath LLP

(57) ABSTRACT

In a solid-state imaging device 1, an overflow gate (OFG) 5 has a predetermined electric resistance value, while voltage application units $16_1$ to $16_5$ are electrically connected to the OFG 5 at connecting parts $17_1$ to $17_5$. Therefore, when voltage values V1 to V5 applied to the connecting parts $17_1$ to $17_5$ by the voltage application units $16_1$ to $16_5$ are adjusted, the OFG 5 can yield higher and lower voltage values in its earlier and later stage parts, respectively. As a result, the barrier level (potential) becomes lower and higher in the earlier and later stage parts, so that all the electric charges generated in an earlier stage side region of photoelectric conversion units 2 can be caused to flow out to an overflow drain (OFD) 4, whereby only the electric charges generated in a later stage side region of the photoelectric conversion units 2 can be TDI-transferred.

6 Claims, 5 Drawing Sheets

SOLID IMAGING DEVICE INCLUDING PHOTOELECTRIC CONVERSION UNIT AND TDI TRANSFER UNIT

TECHNICAL FIELD

The present invention relates to a solid-state imaging device of TDI (Time Delay Integration) transfer type.

BACKGROUND ART

TDI transfer type solid-state imaging devices are devices in which, during vertical transfer of electric charges in photoelectric conversion units, the electric charges are transferred at the same speed in the same direction as with an object to be imaged, so that exposure is integrated by the number of vertical stages of pixels. Letting M be the number of integration stages for performing integrated exposure, for example, electric charges multiplied by M are accumulated, whereby a sensitivity which is M times higher than that of a linear image sensor can be achieved.

Meanwhile, various solid-state imaging devices have been proposed in order to be able to attain an appropriate sensitivity whether the object is relatively bright or dark (i.e., in order to be able to widen the dynamic range). Patent Literature 1 discloses a solid-state imaging device constructed such that barrier levels of overflow gates extending along photoelectric conversion units are lowered in the earlier stage part of the vertical transfer, so as to suppress the accumulated capacity of electric charges in the earlier stage part of the photoelectric conversion units. Patent Literature 2 discloses a solid-state imaging device constructed such that electric charges generated in the earlier stage part of the photoelectric conversion units are transferred into a direction opposite to the transfer direction.

CITATION LIST

Patent Literature

Patent Literature 1: Japanese Translated International Application Laid-Open No. 2003-521837
Patent Literature 2: Japanese Patent Application Laid-Open No. 11-298805

SUMMARY OF INVENTION

Technical Problem

However, the solid-state imaging device disclosed in Patent Literature 1 cannot steplessly change the number of stages of integration for performing integrated exposure, since the barrier levels of the overflow gates are fixed values set at the time of manufacture. Though the solid-state imaging device disclosed in Patent Literature 2 can theoretically change the number of stages of integration for performing integrated exposure steplessly if all the stages are provided with terminals for feeding transfer signals, such a structure is unpractical.

In view of such circumstances, it is an object of the present invention to provide a solid-state imaging device which can steplessly change the number of stages of integration for performing integrated exposure.

Solution to Problem

For achieving the above-mentioned object, the solid-state imaging device in accordance with the present invention comprises a photoelectric conversion unit, disposed along a predetermined direction, for generating an electric charge according to light incident thereon; a TDI transfer unit for TDI-transferring the electric charge generated in the photoelectric conversion unit from an earlier stage side to a later stage side along the predetermined direction; an overflow drain, disposed along the photoelectric conversion unit, including an overflow gate having a predetermined electric resistance value; and a voltage application unit electrically connected to the overflow gate at a plurality of connecting parts on the overflow gate.

In this solid-state imaging device, the overflow gate has a predetermined electric resistance value, while the voltage application unit is electrically connected to the overflow gate at a plurality of connecting parts. Therefore, when voltage values applied to a plurality of connecting parts by the voltage application unit are adjusted, the overflow gate can function as a split resistance, so that the earlier and later stage parts of the overflow gate yield higher and lower voltage values, respectively. As a result, the barrier level (potential) becomes lower and higher in the earlier and later stage parts of the overflow gate, respectively, so that all the electric charges generated in a predetermined region on the earlier stage side in the photoelectric conversion unit can be caused to flow out to the overflow drain, whereby only the electric charges generated in a predetermined region on the later stage side in the photoelectric conversion unit can be TDI-transferred. Hence, by adjusting the voltage values applied to a plurality of connecting parts by the voltage application unit, this solid-state imaging device can steplessly change the number of stages of integration for performing integrated exposure.

Preferably, in the solid-state imaging device in accordance with the present invention, the connecting parts are located at both end portions in the predetermined direction of the overflow gate and at an intermediate portion in the predetermined direction of the overflow gate, while the connecting part located at the intermediate portion is positioned at least on the later stage side of a center portion in the predetermined direction of the overflow gate. Preferably, the connecting parts adjacent to each other have a narrower gap therebetween on the later stage side. These structures allow the voltage value occurring in the overflow gate to be set finer on the later stage side in the transfer direction.

Preferably, in the solid-state imaging device, the voltage application unit changes the barrier level of the overflow gate by applying a voltage thereto such that all the electric charges generated in a predetermined region on the earlier stage side in the photoelectric conversion unit flow out to the overflow drain. In this case, only the electric charges generated in the predetermined region on the later stage side in the photoelectric conversion unit can be TDI-transferred as mentioned above.

Advantageous Effects of Invention

The solid-state imaging device in accordance with the present invention can steplessly change the number of stages of integration for performing integrated exposure.

DESCRIPTION OF EMBODIMENTS

Figure 1:
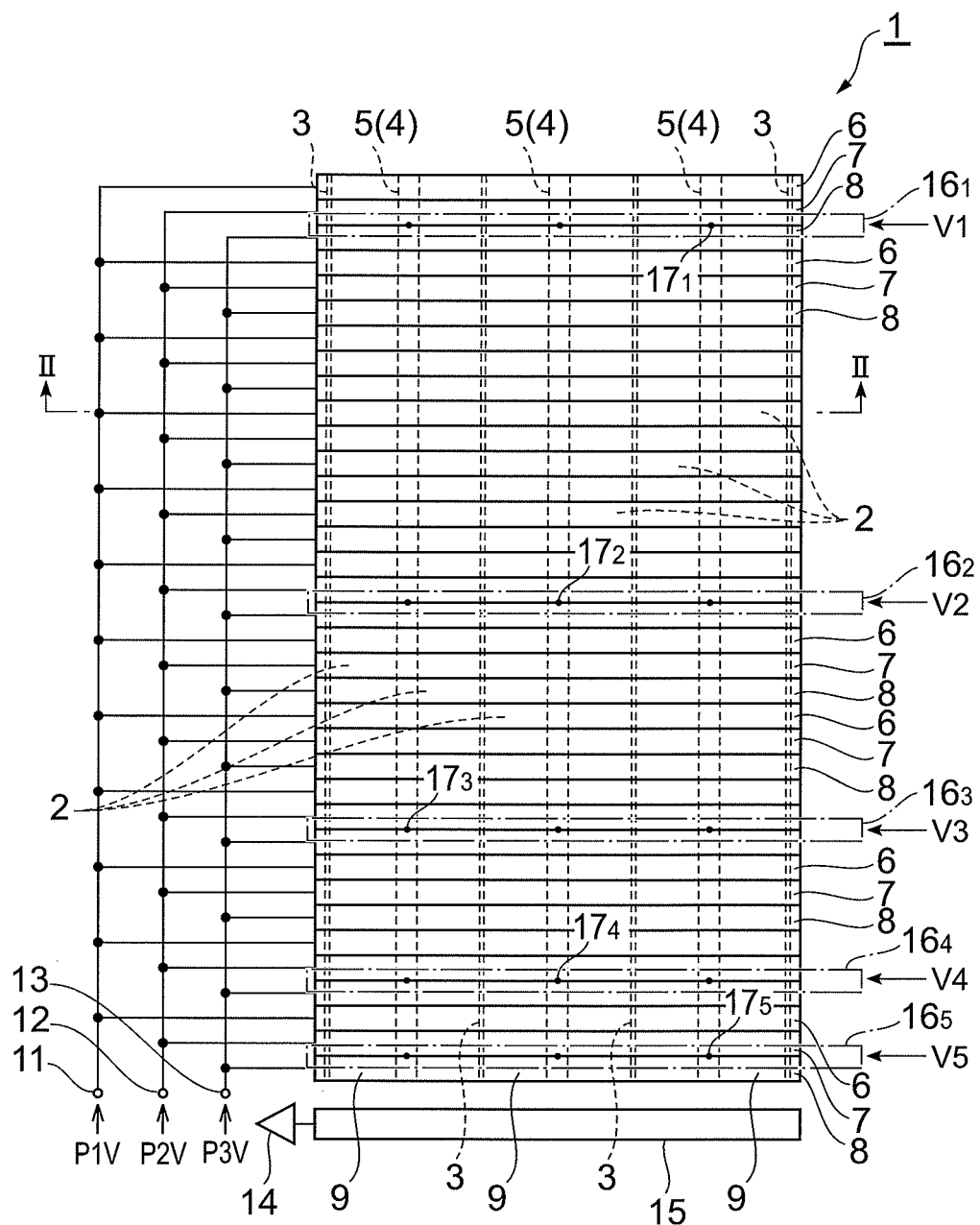
FIG. 1 is a plan view of an embodiment of the solid-state imaging device in accordance with the present invention.

In the following, preferred embodiments of the present invention will be explained in detail with reference to the drawings. In the drawings, the same or equivalent parts will be referred to with the same signs while omitting their overlapping descriptions.

FIG. 1 is a plan view of an embodiment of the solid-state imaging device in accordance with the present invention. As illustrated in FIG. 1, the solid-state imaging device 1 comprises a plurality of rows of photoelectric conversion units 2 extending in a vertical direction (predetermined direction). The photoelectric conversion units 2 in the plurality of rows are arranged parallel to a horizontal direction and are sensitive to light incident thereon, so as to generate electric charges corresponding to the intensity of the incident light. An example of the solid-state imaging device 1 is a CCD of TDI transfer type in which the number of vertical pixels is 128.

Between the photoelectric conversion units 2 adjacent to each other, isolation units 3 and overflow drains (OFDs) 4 are alternately disposed so as to extend along the photoelectric conversion units 2. Each isolation unit 3 electrically separates its adjacent photoelectric conversion units 2 from each other. Each OFD 4 includes an overflow gate (OFG) 5 having a predetermined electric resistance value (e.g., 20 Ω/sq), while the portion of electric charges exceeding the accumulation capacity corresponding to the barrier level (potential) of the OFG 5 flows out from the photoelectric conversion units 2 to the OFD 4. This can prevent the portion of electric charges exceeding the accumulation capacity of the photoelectric conversion unit 2, when generated therein, from leaking out to its adjacent photoelectric conversion unit 2 (i.e., blooming).

On the photoelectric conversion units 2, transfer electrodes 6 to 8 are disposed so as to extend over the plurality of rows of photoelectric conversion units 2 arranged parallel to the horizontal direction. A plurality of sets of transfer electrodes 6 to 8 are periodically arranged in the order of transfer electrodes 6, 7, 8, while being electrically insulated from one another. The transfer electrodes 6 to 8 are electrically connected to terminals 11 to 13, respectively. The terminals 11 to 13 are fed with three-phase transfer signals P1V, P2V, and P3V, respectively. Consequently, the transfer electrodes 6 to 8 function as vertical shift registers (TDI transfer units) 9, which construct one pixel by one period and TDI-transfer electric charges generated in the photoelectric conversion units 2 from the earlier stage side to the later stage side along the vertical direction. Disposed on the later stage side of the photoelectric conversion units 2 is a horizontal shift register 15 by which the electric charges TDI-transferred by the vertical shift registers 9 are transferred to an amplifier 14.

Horizontally extending voltage application units $16_1$ to $16_5$ are electrically connected to the OFGs 5 at a plurality of connecting parts $17_1$ to $17_5$ on each OFG 5. In each OFG 5, the connecting parts $17_1$ and $17_5$ are located at the end portions on the earlier and later stage sides, respectively. The connecting parts $17_2$ to $17_4$ are located at the intermediate portion of each OFG 5, among which the connecting parts $17_3$, $17_4$ are positioned on the later stage side in the transfer direction of the center portion in the vertical direction of the OFG 5. The gaps between the connecting parts $17_1$ to $17_5$ adjacent to each other are narrower on the later stage side in the transfer direction.

Figure 2:
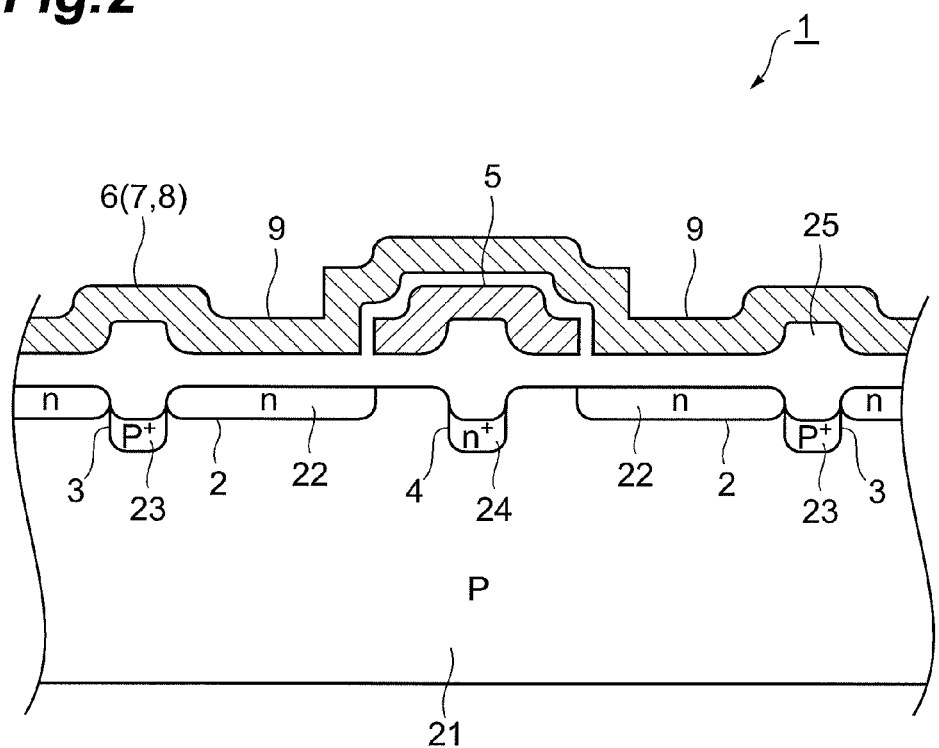
FIG. 2 is a partly enlarged sectional view taken along the line II-II of FIG. 1.

FIG. 2 is a partly enlarged sectional view taken along the line II-II of FIG. 1. As illustrated in FIG. 2, each photoelectric conversion unit 2 is constructed by forming an n-type semiconductor layer 22 on a p-type semiconductor layer 21 so as to attain a pn junction. Each isolation part 3 is constructed by forming a p$^+$-type semiconductor layer 22 on the p-type semiconductor layer 21, while each OFD 4 is constructed by forming an n$^+$-type semiconductor layer 24 on the p-type semiconductor layer 21.

On the p-type semiconductor layer 21, an insulating layer 25 is formed so as to cover the n-, p$^+$-, and n$^+$-type semiconductor layers 22, 23, 24. The OFG 5 is formed so as to oppose each OFD 4 within the insulating layer 25, while transfer electrodes 6 to 8 are formed on the insulating layer 25.

By way of example, the semiconductor is Si, "high impurity concentration" means an impurity concentration of about $1 \times 10^{17}$ cm$^{-3}$ or higher and is indicated by "+" attached to the conduction type, and "low impurity concentration" means an impurity concentration of about $1 \times 10^{15}$ cm$^3$ or lower and is indicated by "−" attached to the conduction type. An example of n-type impurities is arsenic, while an example of p-type impurities is boron. An example of materials for the OFG 5 and transfer electrodes 6 to 8 is polysilicon, while an example of materials for the insulating layer 25 is SiO$_2$.

Figure 3:
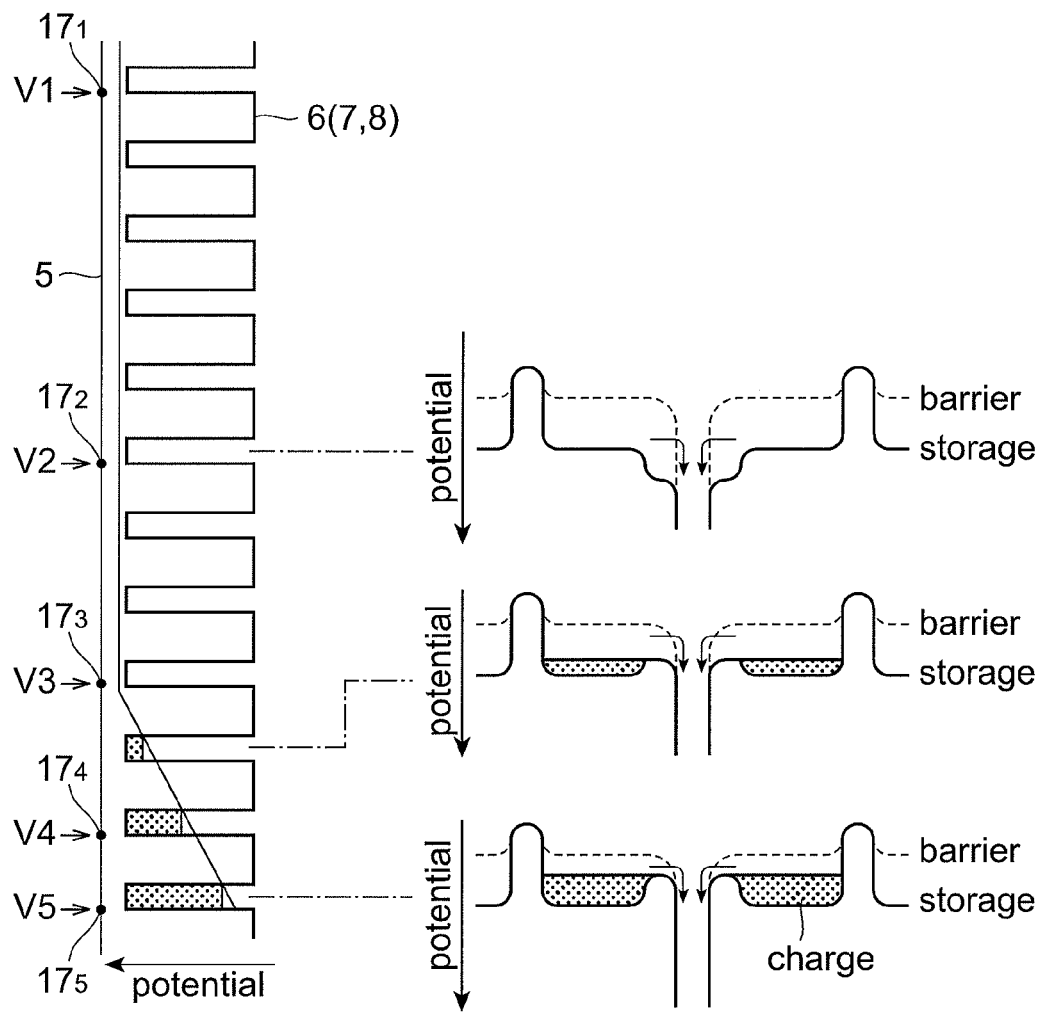
FIG. 3 is a schematic diagram illustrating the barrier level of an overflow gate in the solid-state imaging device of FIG. 1.

FIG. 3 is a schematic diagram illustrating the barrier level of an overflow gate in the solid-state imaging device of FIG. 1. Positively ionized donors exist in n-type semiconductors, while negatively ionized acceptors exist in p-type semiconductors. In the semiconductors, the potential is higher in those of n-type than in those of p-type. In other words, the downward direction is the positive direction of potential in the energy band chart, so that the n-type semiconductors have a potential deeper (higher) than that of the p-type semiconductors, thereby exhibiting lower energy levels. When a positive electric potential occurs in the OFG 5, the potential of the semiconductor region corresponding to the OFG 5 becomes deeper (greater in the positive direction). As the positive electric potential occurring in the OFG 5 is lower, the potential of the semiconductor region directly under its corresponding electrode becomes shallower (smaller in the positive direction).

As illustrated in FIG. 3, when the voltage application units $16_1$ to $16_5$ apply voltage values V1 to V5 (here, V1 to V3: high voltages; V4: open; V5: low voltage) to the connecting parts $17_1$ to $17_5$, respectively, the barrier level (potential) of the OFG 5 becomes an all reset state (barrier level 0 state) in the region on the earlier stage side of the connecting part $17_3$, and an anti-blooming functioning state (a state where the barrier level gradually linearly increases to the later stage side in the transfer direction) in the region on the later stage side of the connecting part $17_3$. That is, the voltage application units $16_1$ to $16_5$ change the barrier level of the OFG 5 by applying voltages thereto such that all the electric charges generated in a predetermined region on the earlier stage side of the photoelectric conversion units 2 (the region on the earlier stage side of the connecting part $17_3$ in the transfer direction) flow out to the OFD 4. Consequently, all the electric charges generated in the predetermined region on the earlier stage side in the photoelectric conversion units 2 (the region on the earlier stage side of the connecting part $17_3$ in the transfer direction) flow out to the OFD 4, so that only the electric charges generated in a predetermined region on the later stage side in the photoelectric conversion units 2 (the region on the later stage side of the connecting part $17_3$ in the transfer direction) are TDI-transferred.

In the solid-state imaging device 1, as explained in the foregoing, the OFG 5 has a predetermined electric resistance value, while the voltage application units $16_1$ to $16_5$ are electrically connected to the OFG 5 at the connecting parts $17_1$ to $17_5$. Therefore, when the voltage values V1 to V5 applied to the connecting parts $17_1$ to $17_5$ by the voltage application units $16_1$ to $16_5$ are adjusted, the OFG 5 can function as a split resistance, so that the earlier and later stage parts of the OFG 5 yield higher and lower voltage values, respectively. As a result, the barrier level (potential) becomes lower and higher in the earlier and later stage parts of the OFG 5, respectively, so that all the electric charges generated in a predetermined region on the earlier stage side in the photoelectric conversion units 2 can be caused to flow out to the OFD 4, whereby only the electric charges generated in a predetermined region on the later stage side in the photoelectric conversion units 2 can be TDI-transferred. Hence, by adjusting the voltage values V1 to V5 applied to the connecting parts $17_1$ to $17_5$ by the voltage application units $16_1$ to $16_5$, the solid-state imaging device 1 can steplessly change the number of stages of integration (integrated number of pixels) for performing integrated exposure.

Figure 4:
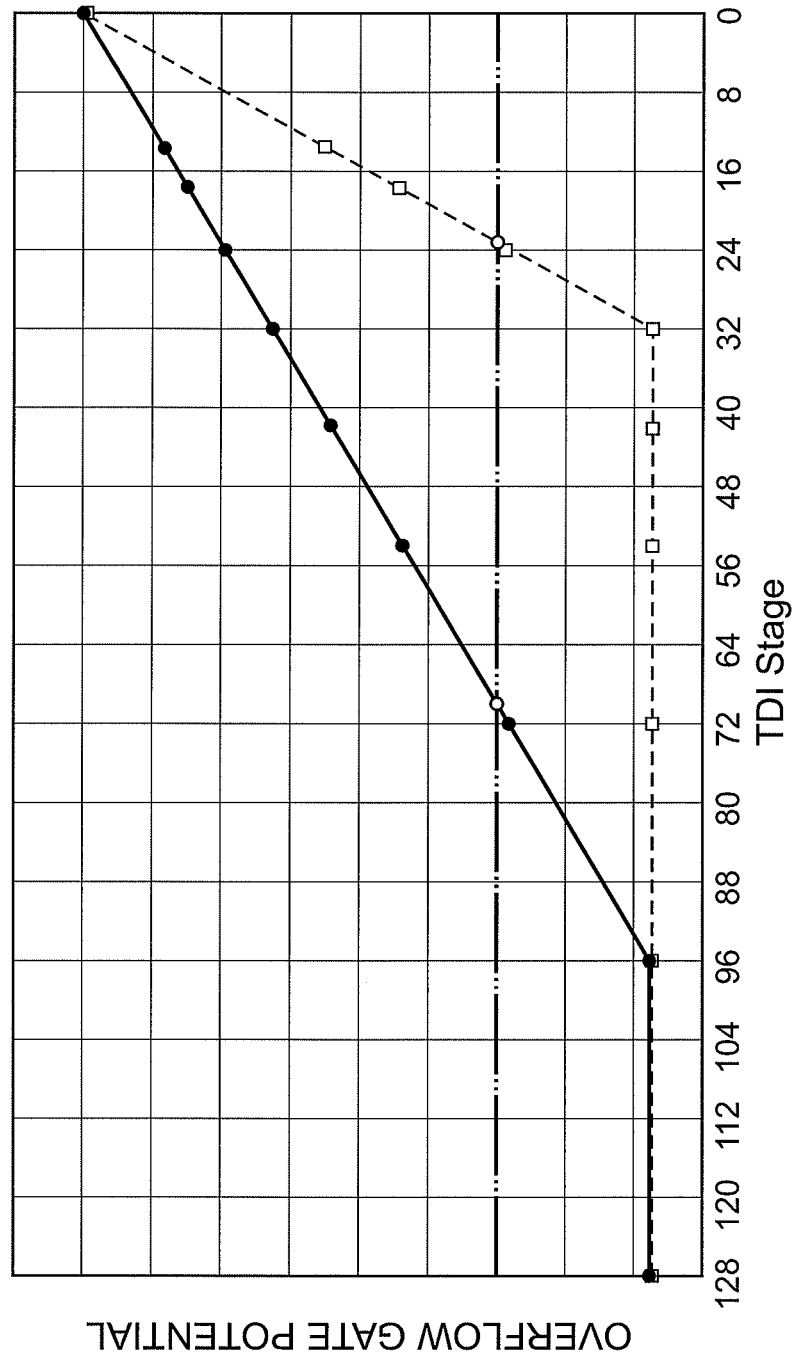
FIG. 4 is a graph illustrating a relationship between the number of stages of integration for performing integrated exposure and the overflow gate barrier level.
Figure 5:
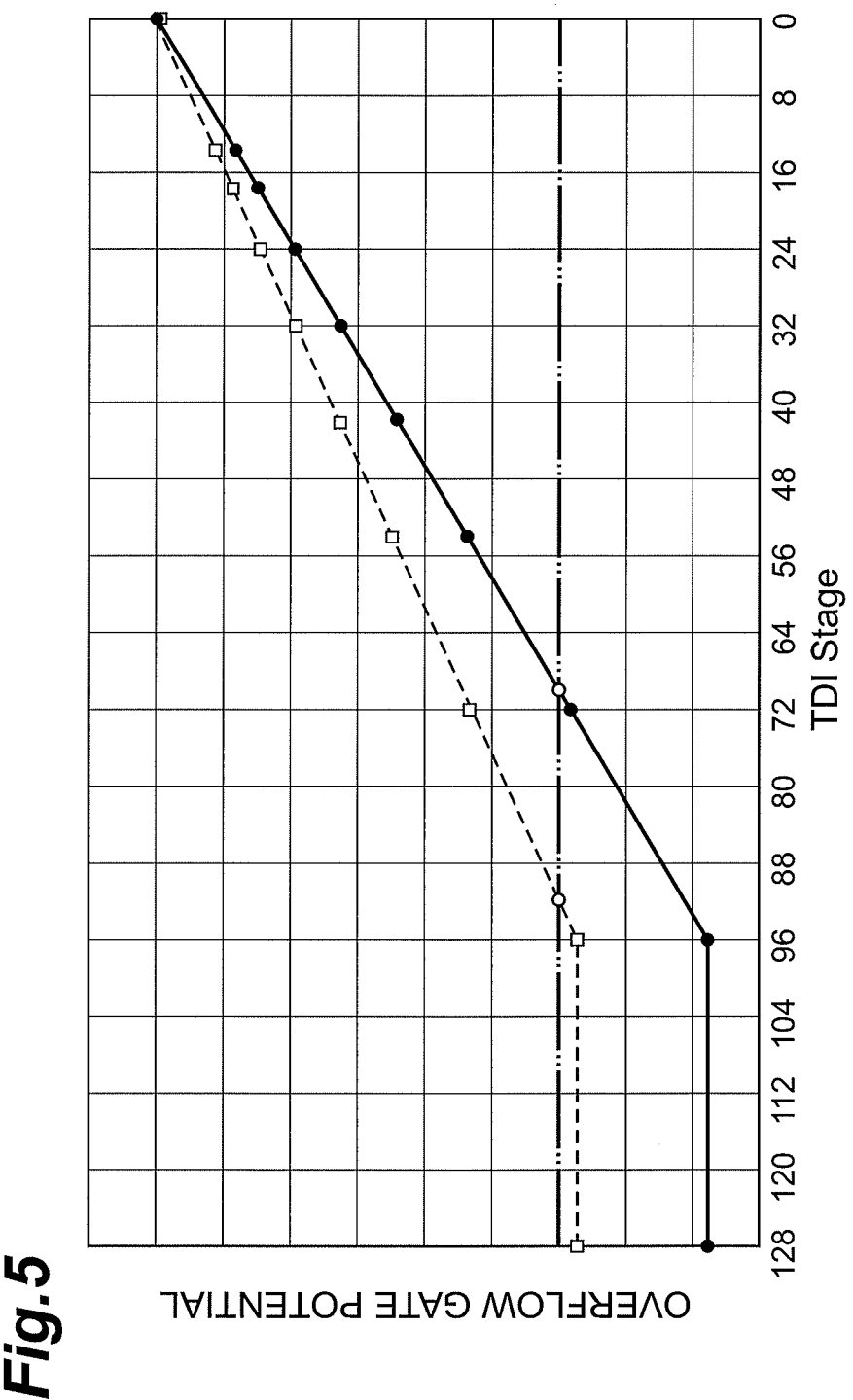
FIG. 5 is a graph illustrating a relationship between the number of stages of integration for performing integrated exposure and the overflow gate barrier level.

When the position of the voltage application unit 16 for applying a high voltage is changed, for example, the number of stages of integration for performing integrated exposure can be switched between 70 and 24 as illustrated in FIG. 4. This chart represents the potential of the overflow gate with respect to each stage of TDI, while the dash-double-dot line on the lower side indicates the potential of the channel. A point at which the potential of the overflow gate and the dash-double-dot line on the lower side intersect indicates a TDI stage where no barrier exists, so that all the electric charges generated in the channel flow to the overflow drain in the part with a greater TDI stage where the potential of the overflow gate is deeper. As illustrated similarly in FIG. 5, the number of stages for performing integrated exposure can be switched between 92 and 70. Though the accumulated capacity of electric charges is low in the stage (pixel) at which electric charges begin to accumulate, this is unproblematic since electric charges are gradually accumulated in the TDI transfer system.

The connecting parts $17_1$ to $17_5$ are located at both end portions in the vertical direction of the OFG 5 and at an intermediate portion in the vertical direction of the OFG 5, while the connecting parts $17_3$, $17_4$ in the connecting parts $17_2$ to $17_4$ located at the intermediate portion are positioned at least on the later stage side of the center portion in the vertical direction of the OFG 5. Further, gaps between the connecting parts $17_1$ to $17_5$ adjacent to each other are narrower on the later stage side in the transfer direction. These structures allow the voltage values occurring in the OFG 5 to be set finer on the later stage side in the transfer direction.

The present invention is not limited to the above-mentioned embodiment. For example, the electric potential gradient and potential gradient occurring in the OFG 5 may gradually increase like a curve or staircase to the later stage side in the transfer direction.

INDUSTRIAL APPLICABILITY

The present invention can provide a solid-state imaging device which can steplessly change the number of stages of integration for performing integrated exposure.

REFERENCE SIGNS LIST

1 . . . solid-state imaging device; 2 . . . photoelectric conversion unit; 4 . . . overflow drain; 5 . . . overflow gate; 9 . . . vertical shift register (TDI transfer unit); $16_1$ to $16_5$ . . . voltage application unit; $17_1$ to $17_5$ . . . connecting part

The invention claimed is:

1. A solid-state imaging device comprising:
a photoelectric conversion unit, disposed along a predetermined direction, for generating an electric charge according to light incident thereon;
a TDI transfer unit for TDI-transferring the electric charge generated in the photoelectric conversion unit from an earlier stage side to a later stage side along the predetermined direction, the TDI transfer unit configured so as to operate on a plurality of pixels at the same time;
an overflow drain, disposed along the photoelectric conversion unit, including an overflow gate having a predetermined electric resistance value and earlier stage and later stage side parts; and
a voltage application unit electrically connected to apply voltage values to the overflow gate at a plurality of connecting parts of the overflow gate, wherein the voltage application unit is configured to adjust the voltage values applied to the plurality of connecting parts of the overflow gate, and the overflow gate is configured to respond to the voltage application unit adjusting the voltage values applied to the plurality of connecting parts of the overflow gate by yielding respectively higher and lower voltage values at the earlier stage and later stage side parts of the overflow gate.

2. A solid-state imaging device according to claim 1, wherein the connecting parts are located at both end portions of the overflow gate in the predetermined direction and at an intermediate portion of the overflow gate in the predetermined direction; and
wherein the connecting part located at the intermediate portion is positioned at least on the later stage side of a center portion of the overflow gate in the predetermined direction.

3. A solid-state imaging device according to claim 1, wherein gaps between adjacent connecting parts increase in narrowness towards the later stage side along the predetermined direction.

4. A solid-state imaging device according to claim 1, wherein the voltage application unit changes the barrier level of the overflow gate by applying a voltage thereto such that all the electric charges generated in a predetermined region on the earlier stage side in the photoelectric conversion unit flow out to the overflow drain.

5. A solid-state imaging device according to claim 1, wherein the voltage application unit applies voltage to the overflow gate such that a potential gradient occurring in the overflow gate gradually increases from the earlier stage side towards the later stage side.

6. A solid-state imaging device according to claim 1, wherein, when the voltage application unit adjusts the voltage values applied to the plurality of connecting parts of the overflow gate, the overflow gate comprises a split resistance which causes the yielding of the respectively higher and lower voltage values at the earlier stage and later stage side parts of the overflow gate.

* * * * *

UNITED STATES PATENT AND TRADEMARK OFFICE
CERTIFICATE OF CORRECTION

| | | |
|---|---|---|
| PATENT NO. | : 9,491,384 B2 | Page 1 of 1 |
| APPLICATION NO. | : 13/258344 | |
| DATED | : November 8, 2016 | |
| INVENTOR(S) | : Hisanori Suzuki et al. | |

It is certified that error appears in the above-identified patent and that said Letters Patent is hereby corrected as shown below:

On the Title Page

In Item (54) of the above-identified patent, change "SOLID IMAGING DEVICE INCLUDING PHOTOELECTRIC CONVERSION UNIT AND TDI TRANSFER UNIT" to --SOLID-STATE IMAGING DEVICE INCLUDING PHOTOELECTRIC CONVERSION UNIT AND TDI TRANSFER UNIT--

Signed and Sealed this
Fourth Day of April, 2017

Michelle K. Lee
*Director of the United States Patent and Trademark Office*